United States Patent
Hsiang et al.

(10) Patent No.: US 11,927,870 B2
(45) Date of Patent: Mar. 12, 2024

(54) PIXEL STRUCTURE AND DISPLAY DEVICE USING THE SAME

(71) Applicant: Acer Incorporated, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 668 days.

(21) Appl. No.: 17/030,981

(22) Filed: Sep. 24, 2020

(65) Prior Publication Data

US 2021/0397062 A1   Dec. 23, 2021

(30) Foreign Application Priority Data

Jun. 18, 2020   (TW) .................................. 109120550

(51) Int. Cl.

| G02F 1/1677 | (2019.01) |
|---|---|
| G02F 1/167 | (2019.01) |
| G02F 1/16757 | (2019.01) |
| G02F 1/16766 | (2019.01) |
| H01L 25/16 | (2023.01) |
| H01L 33/58 | (2010.01) |
| H01L 33/62 | (2010.01) |

(52) U.S. Cl.
CPC ............ *G02F 1/1677* (2019.01); *G02F 1/167* (2013.01); *G02F 1/16757* (2019.01); *G02F 1/16766* (2019.01); *H01L 25/167* (2013.01); *H01L 33/58* (2013.01); *H01L 33/62* (2013.01)

(58) Field of Classification Search
CPC . H01L 25/167; G02F 1/1677; G02F 1/16757; G02F 1/16766; G02F 1/167
See application file for complete search history.

(56) References Cited

U.S. PATENT DOCUMENTS

| 7,304,787 B2 | 12/2007 | Whitesides et al. |
|---|---|---|
| 10,691,916 B1 | 6/2020 | Liu et al. |
| 10,795,216 B2 | 10/2020 | Asakura et al. |
| 11,281,066 B2 | 3/2022 | Shiota et al. |

(Continued)

FOREIGN PATENT DOCUMENTS

| CN | 101002129 A | 7/2007 |
|---|---|---|
| CN | 103576353 A | 2/2014 |

(Continued)

OTHER PUBLICATIONS

Chinese language office action dated Feb. 22, 2021, issued in application No. TW 109120550.

(Continued)

*Primary Examiner* — Mariceli Santiago

(74) *Attorney, Agent, or Firm* — McClure, Qualey & Rodack, LLP

(57) ABSTRACT

A pixel structure is provided. The pixel structure includes a display unit and a shading unit, and at least a portion of the shading unit is disposed on the display unit. The display unit includes a pixel switch element and a self-illuminating element, and the self-illuminating element is electrically connected to the pixel switch element. The shading unit includes a shading electrode and a shading layer, and the shading layer is disposed on the self-illuminating element and electrically connected to the shading layer.

19 Claims, 9 Drawing Sheets

(56) References Cited

U.S. PATENT DOCUMENTS

| | | | |
|---|---|---|---|
| 11,402,960 B2 | 8/2022 | Lin | |
| 2018/0173073 A1 | 6/2018 | Wu et al. | |
| 2020/0033689 A1* | 1/2020 | Lee | H10K 59/126 |
| 2020/0050075 A1 | 2/2020 | Lin et al. | |

FOREIGN PATENT DOCUMENTS

| | | | |
|---|---|---|---|
| CN | 106200040 A | 12/2016 | |
| CN | 106526978 A | 3/2017 | |
| CN | 107423723 A | 12/2017 | |
| CN | 107531003 A | 1/2018 | |
| CN | 107636525 A | 1/2018 | |
| CN | 109101833 A | 12/2018 | |
| CN | 109839784 A | 6/2019 | |
| CN | 110780473 A | 2/2020 | |
| CN | 111090208 A | 5/2020 | |
| CN | 111290115 A | 6/2020 | |
| CN | 111381727 A | 7/2020 | |
| JP | 2007-133013 A | 5/2007 | |
| TW | 202016610 A | 5/2020 | |
| WO | 2017/156700 A1 | 9/2017 | |

OTHER PUBLICATIONS

Chinese language office action dated Jun. 5, 2023, issued in application No. CN 202010885697.0.

* cited by examiner

PIXEL STRUCTURE AND DISPLAY DEVICE USING THE SAME

CROSS REFERENCE TO RELATED APPLICATIONS

This application claims the benefit of Taiwan Application No. 109120550, filed Jun. 18, 2020, the entirety of which is incorporated by reference herein.

BACKGROUND

Technical Field

Embodiments of the present disclosure relate to a pixel structure and a display device using the same, and in particular they relate to a pixel structure that is capable of achieving a state of privacy display and a display device using the same.

Description of the Related Art

With the development of science and technology, the functions and applications of electronic devices are becoming more and more diverse. For example, in addition to telecommunications capabilities, portable electronic devices such as mobile phones (or tablets) may also play media, connect to the Internet to send and receive e-mail, socialize through social networks, or perform various other functions and applications. As the behavior of users on electronic devices has progressed from simple telecommunications to various social activities and business transactions on the Internet, the probability of displaying various private information on these electronic devices has also increased. Therefore, how to protect the privacy of users has become an important issue.

The privacy of users can be ensured by implementing the function of controlling (switching) the viewing angle on the electronic device. For example, a special backlight module may be formed in the liquid crystal display to achieve a state of privacy display. However, this method may have disadvantages such as high power consumption, low brightness, and high manufacturing cost. Alternatively, additional auxiliary pixels may be added to the display, and these auxiliary pixels have different optical characteristics from other normal display pixels to achieve a state of privacy display. However, this method is only suitable for large displays, and may have disadvantages such as complicated manufacturing processes and high manufacturing costs.

BRIEF SUMMARY

The embodiments of the present disclosure relate to a pixel structure that is capable of achieving a state of privacy display and a display device using the same. The pixel structure includes a self-illuminating element and a shading layer disposed on the self-illuminating element and electrically connected to the shading layer. It may control (or switch) the shading layer by adjusting the voltage of the shading electrode to achieve a state of privacy display. In the embodiments of the present disclosure, the state of privacy display may be achieved without forming a special backlight module. The pixel structure in the embodiments of the present disclosure has the advantages of low power consumption and high brightness, and the manufacturing process is simple, which may effectively reduce the manufacturing cost and is suitable for small displays.

In accordance with some embodiments of the present disclosure, a pixel structure is provided. The pixel structure includes a display unit and a shading unit, and at least a portion of the shading unit is disposed on the display unit. The display unit includes a pixel switch element and a self-illuminating element, and the self-illuminating element is electrically connected to the pixel switch element. The shading unit includes a shading electrode and a shading layer, and the shading layer is disposed on the self-illuminating element and electrically connected to the shading layer.

In accordance with some embodiments of the present disclosure, a display device is provided. The display device includes a pixel array that includes a plurality of aforementioned pixel structures. The display device also includes a scanning circuit electrically connected to the display unit of each of the pixel structures. The display device further includes a data circuit electrically connected to the display unit of each of the pixel structures. The display device includes a shading control circuit electrically connected to the shading unit of each of the pixel structures.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
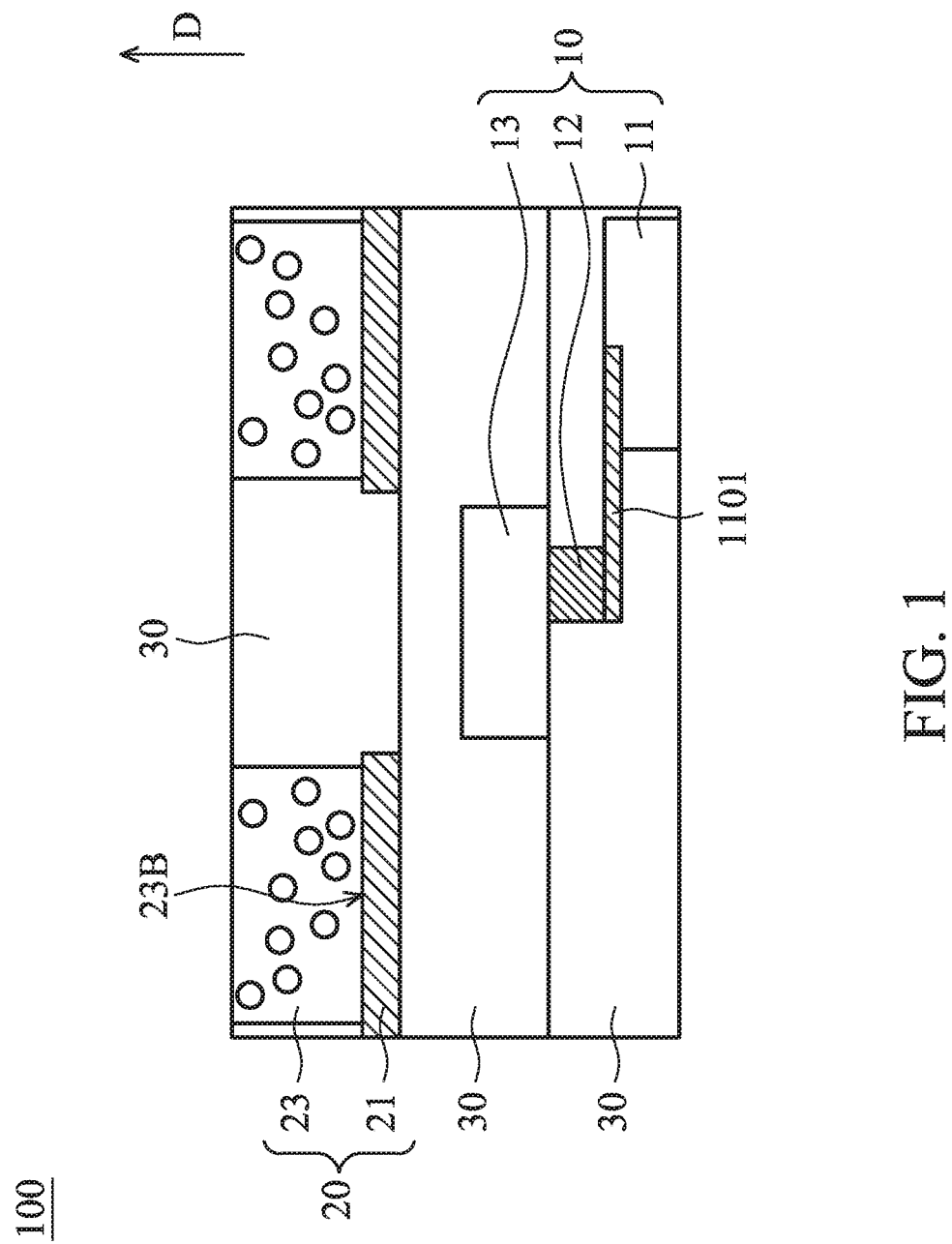
FIG. 1 is a partial cross-sectional view illustrating a pixel structure according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
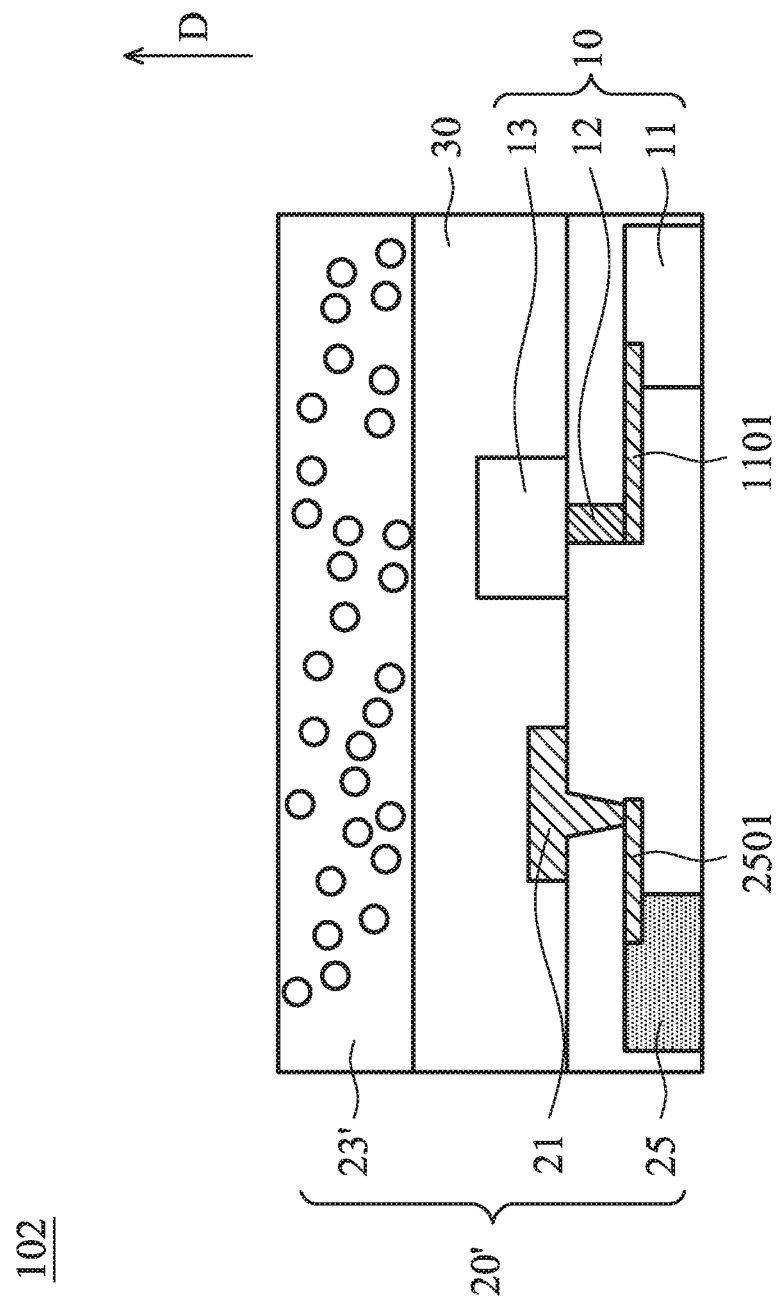
FIG. 2 is a partial cross-sectional view illustrating a pixel structure according to another embodiment of the present disclosure.

FIG. 1 is a partial cross-sectional view illustrating a pixel structure 100 according to an embodiment of the present disclosure. FIG. 2 is a partial cross-sectional view illustrating a pixel structure 102 according to another embodiment of the present disclosure. It should be noted that the pixel structure 100 and the pixel structure 102 in FIG. 1 and FIG. 2 are merely illustrations, and some components may be omitted.

Referring to FIG. 1, the pixel structure 100 includes a display unit 10 and a shading unit 20, and at least a portion of the shading unit 20 is disposed on the display unit 10. In the embodiment of the present disclosure, the shading unit 20 may be used to control (shield) the light emitted from the display unit 10 to implement a function of controlling (switching) the viewing angle on the pixel structure 100, thereby increasing the privacy of users.

Referring to FIG. 1, the display unit 10 includes a pixel switch element 11 and a self-illuminating element 13 that is electrically connected to the pixel switch element 11. In particular, as shown in FIG. 1, the self-illuminating element 13 may be disposed on the pixel switch element 11, and the self-illuminating element 13 may be electrically connected to the pixel switch element 11 by connecting a connection electrode 12 to the extension electrode 1101 of the pixel switch element 11 (e.g., the extension electrode of the drain electrode of the pixel switch element 11), but the present disclosure is not limited thereto. That is, the self-illuminating element 13 may be controlled and/or adjusted by the pixel switch element 11. For example, whether the pixel switch element 11 is energized may determine whether the self-illuminating element 13 emits light, but the present disclosure is not limited thereto.

In some embodiments, the pixel switch element 11 may include a thin film transistor (TFT). For example, the thin film transistor may include a switch substrate. The material of the switch substrate may include glass, sapphire, any other applicable material, or a combination thereof. The thin film transistor may include a plurality of conductive components disposed on the switch substrate. The material of the conductive components may include conductive materials, such as metal, metal silicide, similar materials, or a combination thereof. The thin film transistor may include an insulating layer disposed between the conductive components, and the material of the insulating layer may include oxide (e.g., silicon oxide), nitride (e.g., silicon nitride), any other applicable material, or a combination thereof. The thin film transistor may include a semiconductor layer electrically connected to some conductive components, and the material of the semiconductor layer may include n-type or p-type doped amorphous silicon (a-Si), indium gallium zinc oxide (IGZO), organic thin film transistor (OTFT), and so on, and may be doped using dopants. However, the present disclosure is not limited thereto.

In some embodiments, the connection electrode 12 and the extension electrode 1101 of the pixel switch element 11 may be conductive layers, and the material of the conductive layers may include a metal (e.g., gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof), but the present disclosure is not limited thereto.

In some embodiments, the self-illuminating element 13 may include a micro light-emitting diode (micro-LED, mLED, or μLED). For example, the micro light-emitting diode may include a carrier substrate. The carrier substrate may be a bulk semiconductor substrate or a composite substrate including different materials, and the carrier substrate may be doped (e.g., doped with p-type or n-type dopants) or undoped. The micro light-emitting diode may include a conductive layer disposed on the carrier substrate. The material of the conductive layer may include a metal (e.g., gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof). The micro light-emitting diode may include a plurality of semiconductor layers disposed on the conductive layer. The material of the semiconductor layers is as described above, and will not be repeated here. The micro light-emitting diode may include an active layer disposed between the semiconductor layers. The material of the active layer may include gallium antimonide (GaSb), gallium arsenide (GaAs), indium phosphide (InP), silicon-germanium (SiGe), gallium nitride (GaN), any other applicable material, or a combination thereof. The micro light-emitting diode may include a conductive component disposed on the semiconductor layers. The material of the conductive component is as described above, and will not be repeated here.

For example, the connection electrode 12 and the extension electrode 1101 may be respectively connected to the conductive components of the self-illuminating element 13 and the pixel switch element 11 to electrically connect the self-illuminating element 13 to the pixel switch element 11, but the present disclosure is not limited thereto.

Referring to FIG. 1, the shading unit 20 includes a shading electrode 21 and a shading layer 23 that is disposed on the self-illuminating element 13 and electrically connected to the shading layer 21. In some embodiments, the shading electrode 21 may be disposed on at least one surface of the shading layer 23. For example, as shown in FIG. 1, the shading unit 20 includes a plurality of shading electrodes 21 and a plurality of shading layers 23, each shading electrode 21 is disposed on the bottom surface 23B of the corresponding shading layer 23, and the shading electrodes 21 are disposed on (the self-illuminating element 13 of) the display unit 10, but the present disclosure is not limited thereto. In some other embodiments, each shading electrode 21 may be disposed on other surfaces of the corresponding shading layer 23.

As shown in FIG. 1, in this embodiment, the self-illuminating element 13 of the display unit 10 corresponds to a space between a plurality of shielding layers 23 (or shading electrodes 21). That is, in the normal direction D of the pixel structure 100, the shading layer 23 (or shading electrode 21) does not overlap or only partially overlaps the self-illuminating element 13, but the present disclosure is not limited thereto.

In some embodiments, the material of the shading electrode 21 may include a metal. For example, the metal may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto.

In some embodiments, the material of the shading layer 23 may include a liquid material and a plurality of non-transparent conductive particles in the liquid material. For example, the liquid material may be water, oil, electrolyte or any other applicable liquid material, and the non-transparent conductive particles may be pigments, particles, electrophoresis or other applicable conductive non-transparent materials, but the present disclosure is not limited thereto.

In particular, the non-transparent conductive particles in the shading layer 23 are disposed in the liquid material and may move in the liquid material. Therefore, the position of the non-transparent conductive particles in the shading layer 23 may be controlled by adjusting the voltage of the shading electrode 21, so that the non-transparent conductive particles in the shielding layer 23 may partially shield the light emitted from the self-illuminating element 13, thereby switching between wide viewing angle (e.g., greater than 70 degrees) and narrow viewing angle (privacy viewing angle) (e.g., less than or equal to 70 degrees). Examples will be further described later.

As shown in FIG. 1, in some embodiments, the pixel structure 100 may further include an insulating layer 30 disposed in a space other than the display unit 10 and the shading unit 20. For example, the insulating layer 30 may be disposed between the display unit 10 and the shading unit 20, between the pixel switch element 11 and the self-illuminating element 13, and between a plurality of shading layers 23 (or shading electrodes 21), but the present disclosure is not limited thereto. Moreover, the material of the insulating layer 30 may include oxide (e.g., silicon oxide), nitride (e.g., silicon nitride), any other applicable material, or a combination thereof.

Referring to FIG. 2, the pixel structure 102 has a structure similar to the pixel structure 100 shown in FIG. 1. One of the differences is that the shading unit 20' of the pixel structure 102 further includes a shading switch element 25, and the shading electrode 21 is electrically connected to the shading switch element 25. In some embodiments, the shading switch element 25 may include a thin film transistor. The structure and material of the thin film transistor may be as mentioned above, and will not be repeated here, but the present disclosure is not limited thereto.

In this embodiment, the shading switch element 25 may be formed in the same process as the pixel switch element 11, and the shading electrode 21 may be formed in the same process as the self-illuminating element 13, but the present disclosure is not limited thereto. Therefore, according to the embodiments of the present disclosure, the process time and process complexity of the pixel structure 102 may be effectively reduced.

Similarly, the position of the non-transparent conductive particles in the shading layer 23' may be controlled by adjusting the voltage of the shading electrode 21, so that the non-transparent conductive particles in the shielding layer 23' may partially shield the light emitted from the self-illuminating element 13, thereby switching between wide viewing angle (e.g., greater than 70 degrees) and narrow viewing angle (privacy viewing angle) (e.g., less than or equal to 70 degrees). Moreover, in this embodiment, since the shading layer 23' of the shading unit 20 may be controlled by the shading switch element 25 through the shading electrode 21, when a plurality of pixel structures 102 are displayed, the corresponding shading layer 23' may be individually controlled by the shading switch element 25 of each pixel structure 102. That is, the plurality of pixel structures 102 may respectively exhibit different shielding effects, thereby achieving different viewing angles or different display modes.

It should be noted that although one shading switch element 25 is shown connected to one shading electrode 21 in FIG. 2 (i.e., one shading switch element 25 controls one shading electrode 21), the present disclosure is not limited thereto. In some other embodiments, one shading switch element 25 may also be connected to at least two shading electrodes 21, and the shading switch element 25 may control these shading electrodes 21 simultaneously.

In addition, in this embodiment, the shading layer 23' covers the self-illuminating element 13 of the display unit 10. That is, in the normal direction D of the pixel structure 102, the shading layer 23' overlaps the self-illuminating element 13, but the present disclosure is not limited thereto.

Figure 3:
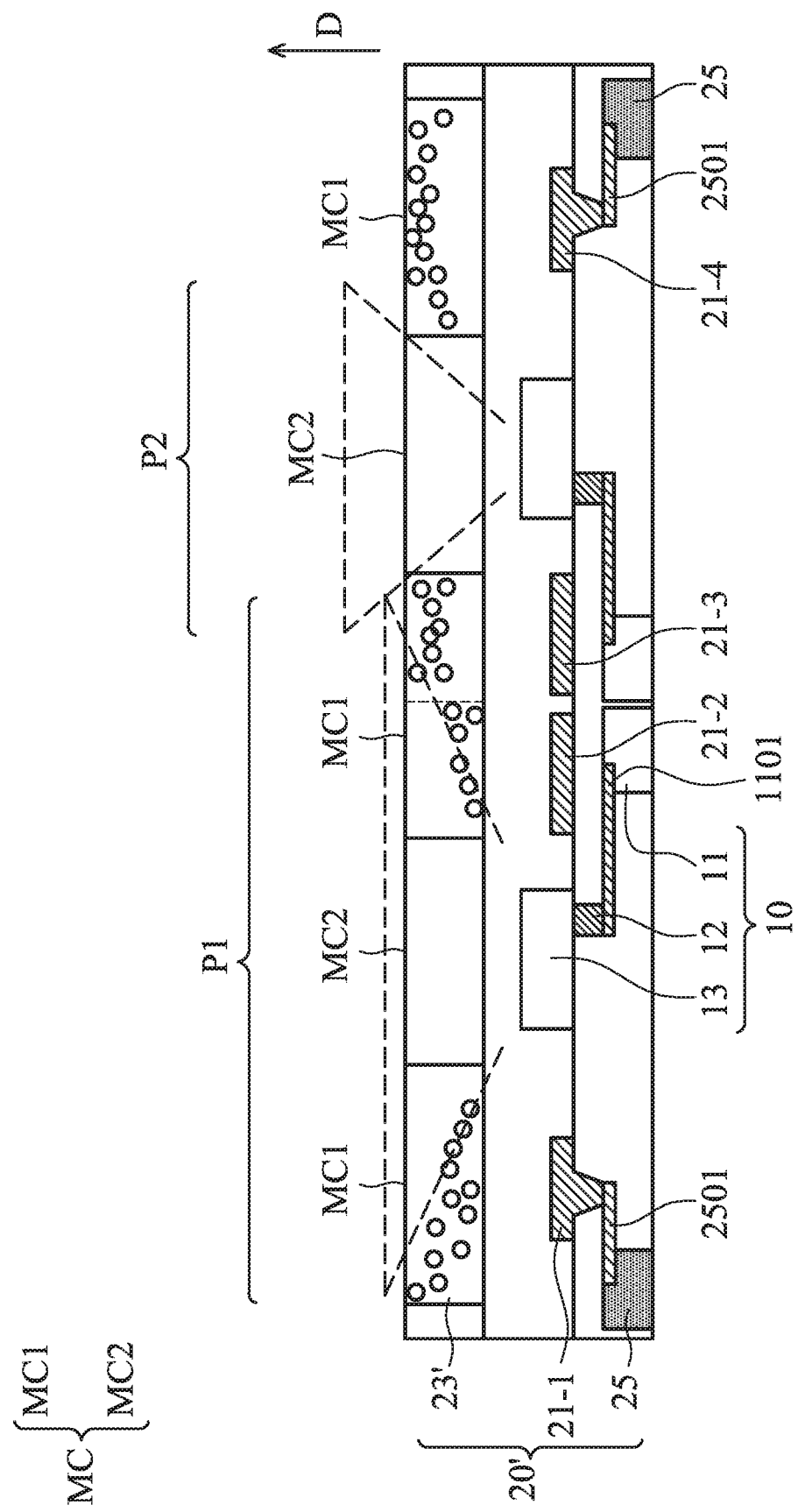
FIG. 3 is a cross-sectional view illustrating a pixel structure according to an embodiment of the present disclosure at a wide viewing angle and a privacy viewing angle.

FIG. 3 is a cross-sectional view illustrating a pixel structure according to an embodiment of the present disclosure at a wide viewing angle and a privacy viewing angle. It should be noted that the pixel P1 presenting the wide viewing angle and the pixel P2 presenting the private viewing angle may be two different states of the same pixel, or two different pixels (e.g., two adjacent pixels) in FIG. 3.

Moreover, although the pixel structure of the pixel P1 and the pixel P2 shown in FIG. 3 corresponds (or is similar) to the pixel structure 102 shown in FIG. 2 (i.e., the shading switch element 25 is included), the present disclosure is not limited thereto. In some other embodiments, the pixel structure of the pixel P1 and the pixel P2 may also correspond (or be similar) to the pixel structure 100 shown FIG. 1 (i.e., the shading switch element 25 is not included), which may be adjusted according to actual need.

In some embodiments, as shown in FIG. 3, the shading layer 23' may include a plurality of microcapsule structures MC. In this embodiment, the microcapsule structures MC uses a natural or synthetic polymer material (capsule material) as the capsule wall shell, and wraps the liquid material of the shading layer 23' and/or a plurality of non-transparent conductive particles into a capsule with a diameter of about 1 micrometer, but the present disclosure is not limited thereto.

In the embodiment shown in FIG. 3, the microcapsule structures are divided into a first portion MC1 and a second portion MC2, the first portion MC1 of the microcapsule structures MC includes the liquid material and the non-transparent conductive particles, and the second portion MC2 of the microcapsule structures MC includes the liquid material but no non-transparent conductive particles. In this embodiment, the second portion MC2 of the microcapsule structures MC is correspondingly disposed on the self-illuminating element 13. That is, in the normal direction D of the pixel P1 and the pixel P2, the first portion MC1 of the microcapsule structures MC does not overlap the self-illuminating element 13, but the present disclosure is not limited thereto. In some other embodiments, the first portion MC1 of the microcapsule structures MC (which includes non-transparent conductive particles) may partially overlap the self-illuminating element 13.

Moreover, in the embodiments shown in FIG. 3, the shading electrode 21-1, the shading electrode 21-2, the shading electrode 21-3, and the shading electrode 21-4 may correspond to the shading electrode 21 shown in FIG. 1 or FIG. 2. When the non-transparent conductive particles in (the first portion MC1 of) the microcapsule structure MC are negatively charged particles, a positive voltage may be applied to the shading electrode 21-1 and the shading electrode 21-2, so that the non-transparent conductive particles are pulled by the electric field to approach the shading electrode 21-1 and the shading electrode 21-2 (i.e., near the bottom of the shading layer 23'), thereby rendering the pixel P1 a wide viewing angle; a negative voltage may be applied to the shading electrode 21-3 and the shading electrode 21-4, so that the non-transparent conductive particles are pulled by the electric field away from the shading electrode 21-3 and the shading electrode 21-4 (i.e., near the top of the shading layer 23'), thereby rendering the pixel P2 a privacy viewing angle.

In contrast, when the non-transparent conductive particles in the microcapsule structure MC are positively charged particles, a negative voltage may be applied to the shading electrode 21-1 and the shading electrode 21-2, so that the non-transparent conductive particles are pulled by the electric field to approach the shading electrode 21-1 and the shading electrode 21-2 (i.e., near the bottom of the shading layer 23'), thereby rendering the pixel P1 a wide viewing angle; a positive voltage may be applied to the shading electrode 21-3 and the shading electrode 21-4, so that the non-transparent conductive particles are pulled by the electric field away from the shading electrode 21-3 and the shading electrode 21-4 (i.e., near the top of the shading layer 23'), thereby rendering the pixel P2 a privacy viewing angle.

Figure 4A:
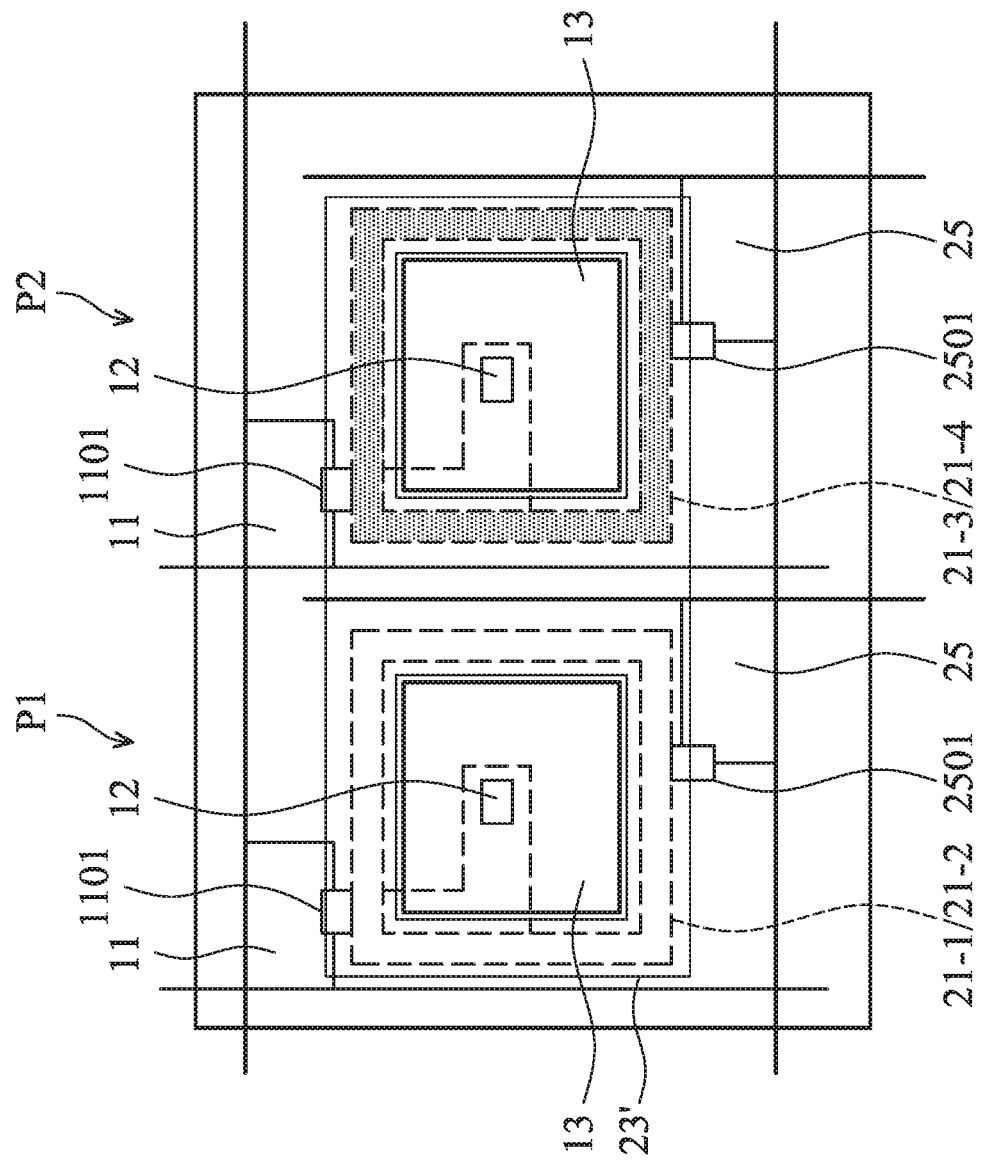
FIG. 4A is an example of a partial top view of the pixel P1 and the pixel P2 of FIG. 3.
Figure 4B:
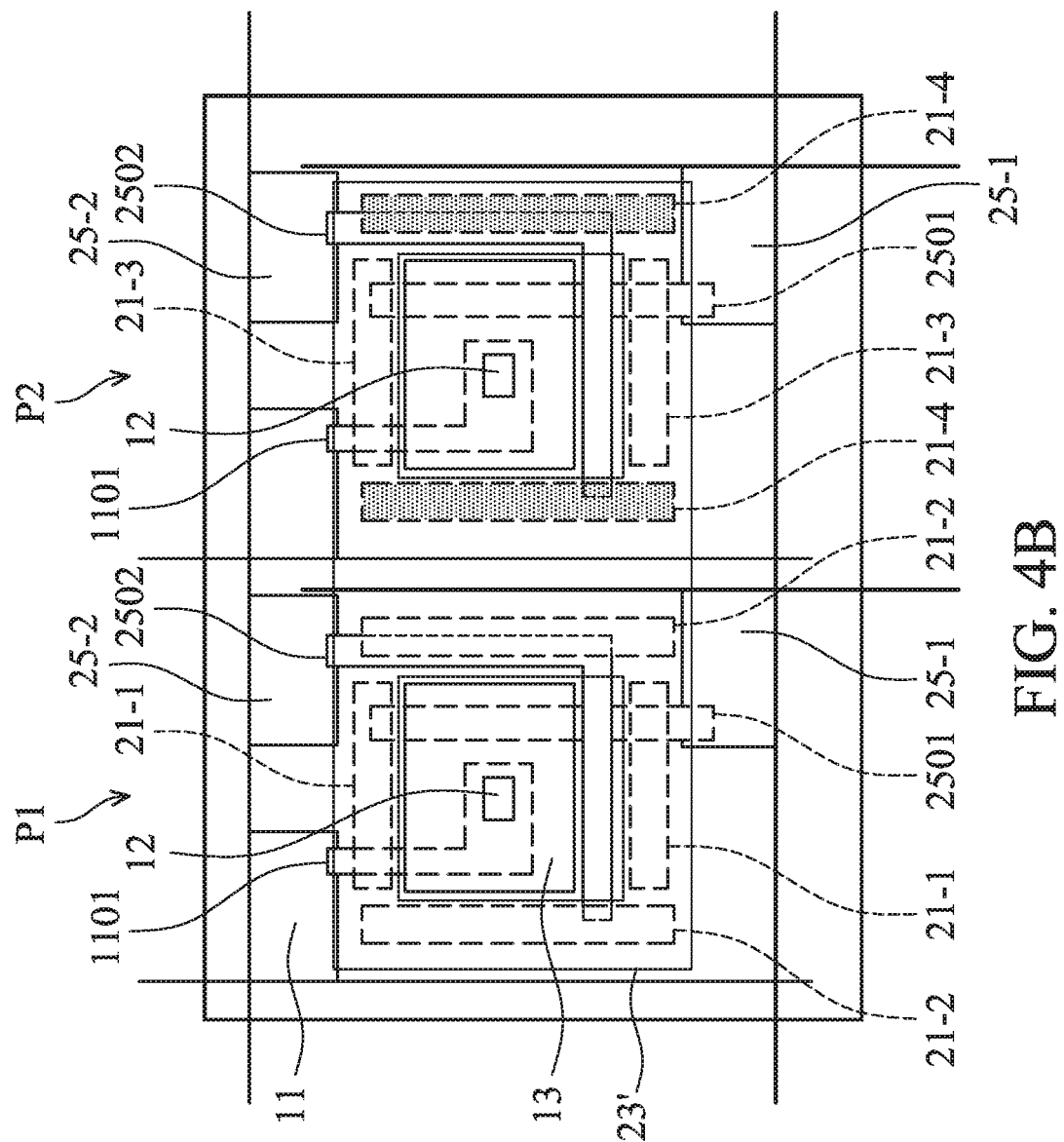
FIG. 4B is another example of a partial top view of the pixel P1 and the pixel P2 of FIG. 3.

FIG. 4A is an example of a partial top view of the pixel P1 and the pixel P2 of FIG. 3. FIG. 4B is another example of a partial top view of the pixel P1 and the pixel P2 of FIG. 3. It should be noted that the components shown in FIG. 4A and FIG. 4B may not completely correspond to those in FIG. 3 in order to more clearly show the relationship of the electrical connection between the components.

Referring to FIG. 4A, in some embodiments, only one shading electrode is included in one pixel (e.g., the pixel P1 or the pixel P2). That is, the shading electrode 21-1 and the shading electrode 21-2 are the same shading electrode, or the shading electrode 21-3 and the shading electrode 21-4 are the same shading electrode. The extension electrode 2501 of (the drain electrode of) the shading switch element 25 is connected to the shading electrode 21-1/the shielding electrode 21-2, and the extension electrode 2501 of (the drain electrode of) the shading switch element 25 is connected to the shading electrode 21-3/the shielding electrode 21-4, but the present disclosure is not limited thereto.

Referring to FIG. 4B, in some other embodiments, two or more shading electrodes may be included in one pixel (e.g., the pixel P1 or the pixel P2). For example, the shading electrode 21-1 and the shielding electrode 21-2 are included in the pixel P1, and the shading electrode 21-3 and the shielding electrode 21-4 are included in the pixel P2. In this embodiment, the extension direction of the shading electrode 21-1 and the extension direction of the shading electrode 21-2 are different, and the extension direction of the shading electrode 21-3 and the extension direction of the shading electrode 21-4 are different.

For example, as shown in FIG. 4B, the shading electrode 21-1 is located on the upper and lower sides of the pixel P1, and the shading electrode 21-2 is located on the left and right sides of the pixel P1; the shading electrode 21-3 is located on the upper and lower sides of the pixel P2, and the shading electrode 21-4 is located on the left and right sides of the pixel P2. That is, the shading electrode 21-1 and the shading electrode 21-2 may be perpendicular to each other, and the shading electrode 21-3 and the shading electrode 21-4 may be perpendicular to each other, but the present disclosure is not limited thereto. The positions and extension directions of the shading electrode 21-1, the shading electrode 21-2, the shading electrode 21-3, and the shading electrode 21-4 may also be different from those shown in FIG. 4B and may be adjusted according to actual need.

In some embodiments, the shading unit of the pixel structure may include a first shading switch element 25-1 and a second shading switch element 25-2. Similarly, the first shading switch element 25-1 may include a thin film transistor, and the second shading switch element 25-2 may include a thin film transistor. As shown in FIG. 4B, in some embodiments, the extension electrode 2501 of (the drain electrode of) the first shading switch element 25-1 is connected to the shading electrode 21-1 or the shielding electrode 21-3, so that the shading electrode 21-1 and the shielding electrode 21-3 are electrically connected to the first shading switch element 25-1; the extension electrode 2502 of (the drain electrode of) the second shading switch element 25-2 is connected to the shading electrode 21-2 or the shielding electrode 21-4, so that the shading electrode 21-2 and the shielding electrode 21-4 are electrically connected to the second shading switch element 25-2, but the present disclosure is not limited thereto.

In some embodiments, the shielding region in the shading layer 23' (i.e., the region shielded by the non-transparent conductive particles in (the first portion MC1 of) the microcapsule structure MC) is approximately the same as the range of the shading electrode. For example, in the embodiment shown in FIG. 4B, the shading electrode 21-1 and the shading electrode 21-3 may be controlled by the first shading switch element 25-1 and the second shading switch element 25-2, respectively, so that the non-transparent conductive particles in the shading layer 23' are moved for shielding, thereby rendering the left and right sides of the pixel P2 a privacy viewing angle, while maintaining the upper and lower sides of the pixel P2 still a wide viewing angle, but the present disclosure is not limited thereto. In some other embodiments, the shading electrode 21-3 and the shading electrode 21-4 may be controlled by the first shading switch element 25-1 and the second shading switch element 25-2, respectively, so that the non-transparent conductive particles in the shading layer 23' are moved for shielding, thereby rendering the upper and lower sides of the pixel P2 a privacy viewing angle, while maintaining the left and right sides of the pixel P2 still a wide viewing angle.

Figure 5:
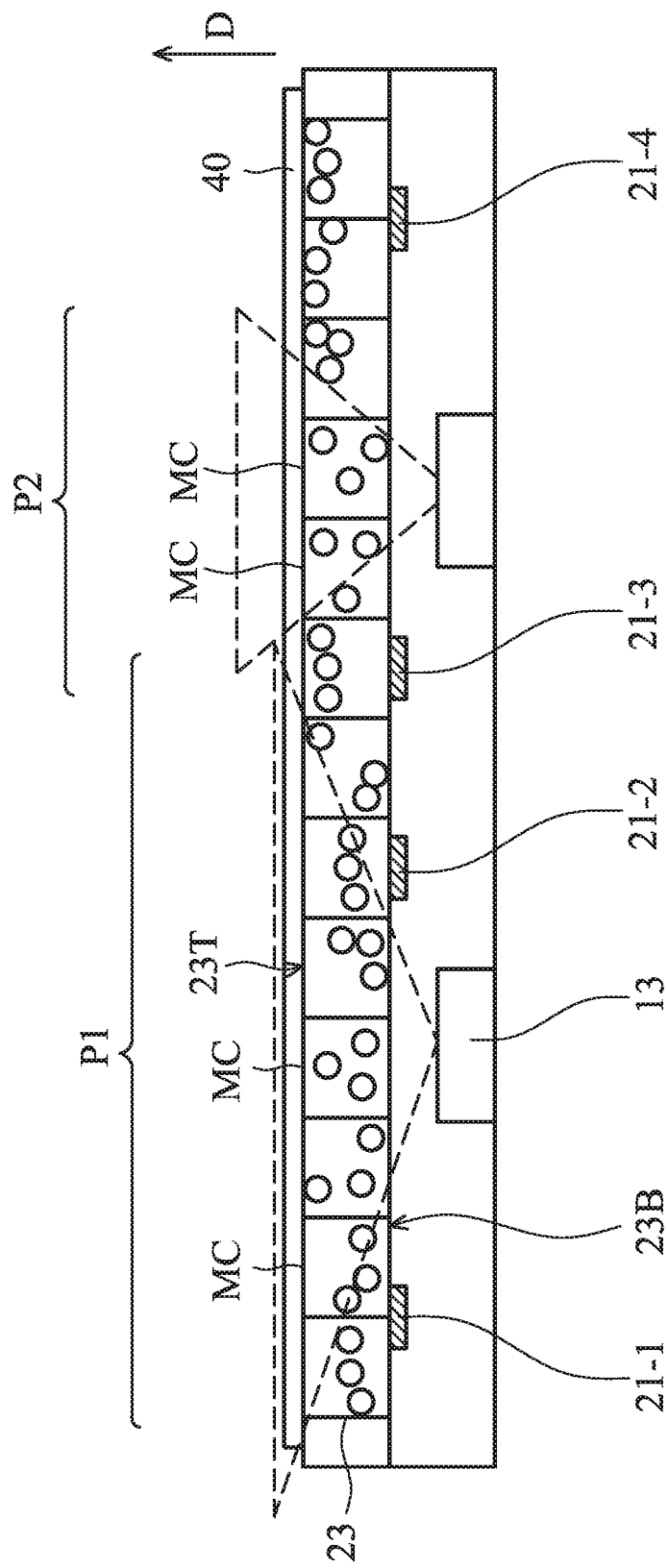
FIG. 5 is a cross-sectional view illustrating a pixel structure according to another embodiment of the present disclosure at a wide viewing angle and a privacy viewing angle.

FIG. 5 is a cross-sectional view illustrating a pixel structure according to another embodiment of the present disclosure at a wide viewing angle and a privacy viewing angle. Similarly, the pixel P1 presenting the wide viewing angle and the pixel P2 presenting the private viewing angle may be two different states of the same pixel, or two different pixels (e.g., two adjacent pixels) in FIG. 5. The pixel structures of the pixel P1 and the pixel P2 shown in FIG. 5 may correspond to the pixel structure 100 shown in FIG. 1 or the pixel structure 102 shown in FIG. 2. Therefore, the pixel switch element 11 (and the shading switch element 25) is omitted in FIG. 5. In addition, the top view of the pixel structure of FIG. 5 may be similar to/correspond to the structure of FIG. 4A or FIG. 4B.

One of the differences from the embodiment shown in FIG. 3 is that the pixel structure shown in FIG. 5 may further include an upper electrode 40 disposed on the shading layer 23. In this embodiment, the upper electrode 40 is disposed on the top surface 23T of the shading layer 23, but the present disclosure is not limited thereto. The upper electrode 40 may be used to further control/adjust the position of the non-transparent conductive particles in the liquid material.

In some embodiments, the material of the upper electrode 40 may be the same as or similar to the material of the shading electrode 21 (or 21-1, 21-2, 21-3, 21-4), which may, for example, include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto.

In addition, in the embodiment shown in FIG. 5, the shading layer 23 may include a plurality of microcapsule structures MC, and each microcapsule structure MC includes the liquid material and the plurality of non-transparent conductive particles, but the present disclosure is not limited thereto. In some other embodiments, the microcapsule structures MC shown in FIG. 5 may be divided into a first portion and a second portion as shown in FIG. 3, the first portion includes the non-transparent conductive particles, and the second portion includes no non-transparent conductive particles.

As shown in FIG. 5, the shading electrode 21-1, the shading electrode 21-2, the shading electrode 21-3, and the shading electrode 21-4 may be disposed on the bottom surface 23B of the shading layer 23, but the present disclosure is not limited thereto. When the non-transparent conductive particles in the microcapsule structure MC are negatively charged particles, a positive voltage may be applied to the shading electrode 21-1 and the shading electrode 21-2, and a relatively low voltage (e.g., negative voltage, low potential, ground, or floating voltage) may be applied to the upper electrode 40, so that the non-transparent conductive particles are pulled by the electric field to approach the shading electrode 21-1 and the shading electrode 21-2 (i.e., away from the upper electrode 40), thereby rendering the pixel P1 a wide viewing angle. A negative voltage may be applied to the shading electrode 21-3 and the shading electrode 21-4, and a relatively high voltage (e.g., positive voltage, high potential, ground, or floating voltage) may be applied to the upper electrode 40; or a relatively low voltage (e.g., negative voltage, low potential, ground, or floating voltage) may be applied to the shading electrode 21-3 and the shading electrode 21-4, and a positive voltage may be applied to the upper electrode 40, so that the non-transparent conductive particles are pulled by the electric field away from the shading electrode 21-3 and the shading electrode 21-4 (i.e., near the upper electrode 40), thereby rendering the pixel P2 a privacy viewing angle.

When the non-transparent conductive particles in the microcapsule structure MC are positively charged particles, a negative voltage may be applied to the shading electrode 21-1 and the shading electrode 21-2, and a relatively high voltage (e.g., positive voltage, high potential, ground, or floating voltage) may be applied to the upper electrode 40, so that the non-transparent conductive particles are pulled by the electric field to approach the shading electrode 21-1 and the shading electrode 21-2 (i.e., away from the upper electrode 40), thereby rendering the pixel P1 a wide viewing angle. A positive voltage may be applied to the shading electrode 21-3 and the shading electrode 21-4, and a relatively low voltage (e.g., negative voltage, low potential, ground, or floating voltage) may be applied to the upper electrode 40; or a relatively high voltage (e.g., positive voltage, high potential, ground, or floating voltage) may be applied to the shading electrode 21-3 and the shading electrode 21-4, and a negative voltage may be applied to the upper electrode 40, so that the non-transparent conductive particles are pulled by the electric field away from the shading electrode 21-3 and the shading electrode 21-4 (i.e., near the upper electrode 40), thereby rendering the pixel P2 a privacy viewing angle.

Figure 6:
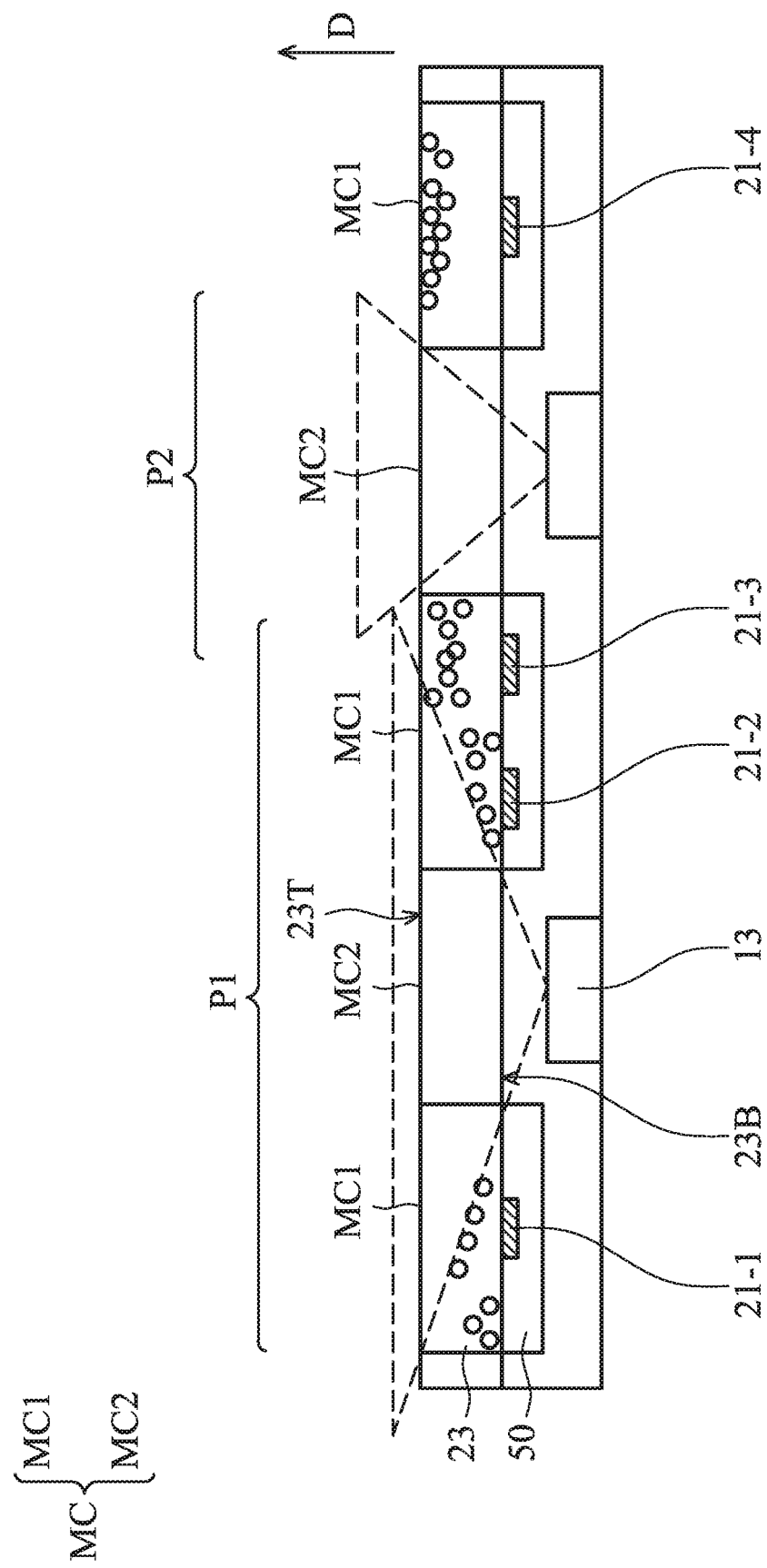
FIG. 6 is a cross-sectional view illustrating a pixel structure according to another embodiment of the present disclosure at a wide viewing angle and a privacy viewing angle.

FIG. 6 is a cross-sectional view illustrating a pixel structure according to another embodiment of the present disclosure at a wide viewing angle and a privacy viewing angle. Similarly, the pixel P1 presenting the wide viewing angle and the pixel P2 presenting the private viewing angle may be two different states of the same pixel, or two different pixels (e.g., two adjacent pixels) in FIG. 6. The pixel structures of the pixel P1 and the pixel P2 shown in FIG. 6 may correspond to the pixel structure 100 shown in FIG. 1 or the pixel structure 102 shown in FIG. 2. Therefore, the pixel switch element 11 (and the shading switch element 25) is omitted in FIG. 6. In addition, the top view of the pixel structure of FIG. 6 may be similar to/correspond to the structure of FIG. 4A or FIG. 4B.

One of the differences from the embodiment shown in FIG. 3 is that the pixel structure shown in FIG. 6 may further include a light-shielding material layer 50, and the shading electrode 21-1, the shading electrode 21-2, the shading electrode 21-3, and/or the shading electrode 21-4 are disposed in the light-shielding material layer 50. That is, the light-shielding material layer 50 is disposed on the bottom surface 23B of the shading layer 23, but the present disclosure is not limited thereto. The light-shielding material layer 50 may further limit the direction of the light emitted from the light-illuminating element 13 to avoid crosstalk. It should be noted that the position of the light-shielding material layer 50 is not limited to that shown in FIG. 6. In some other embodiments, the light-shielding material layer 50 may also be disposed on the top surface 23T of the shading layer 23.

In some embodiments, the material of the light-shielding material layer 50 may include photoresist (e.g., black photoresist, or any other applicable photoresist which is not transparent), ink (e.g., black ink, or any other applicable ink which is not transparent), molding compound (e.g., black molding compound, or any other applicable molding compound which is not transparent), solder mask (e.g., black solder mask, or any other applicable solder mask which is not transparent), epoxy polymer, any other applicable material, or a combination thereof. In some embodiments, the material of the light-shielding material layer 50 may include a light curing material, a thermal curing material, or a combination thereof In this embodiment, the microcapsule structures MC are divided into a first portion MC1 and a second portion MC2, the first portion MC1 includes the liquid material and the non-transparent conductive particles, and the second portion MC2 includes the liquid material but no non-transparent conductive particles, but the present disclosure is not limited thereto. In some other embodiments, each microcapsule structure MC may include the liquid material and the plurality of non-transparent conductive particle as shown in FIG. 5, which will not be repeated here.

Figure 7:
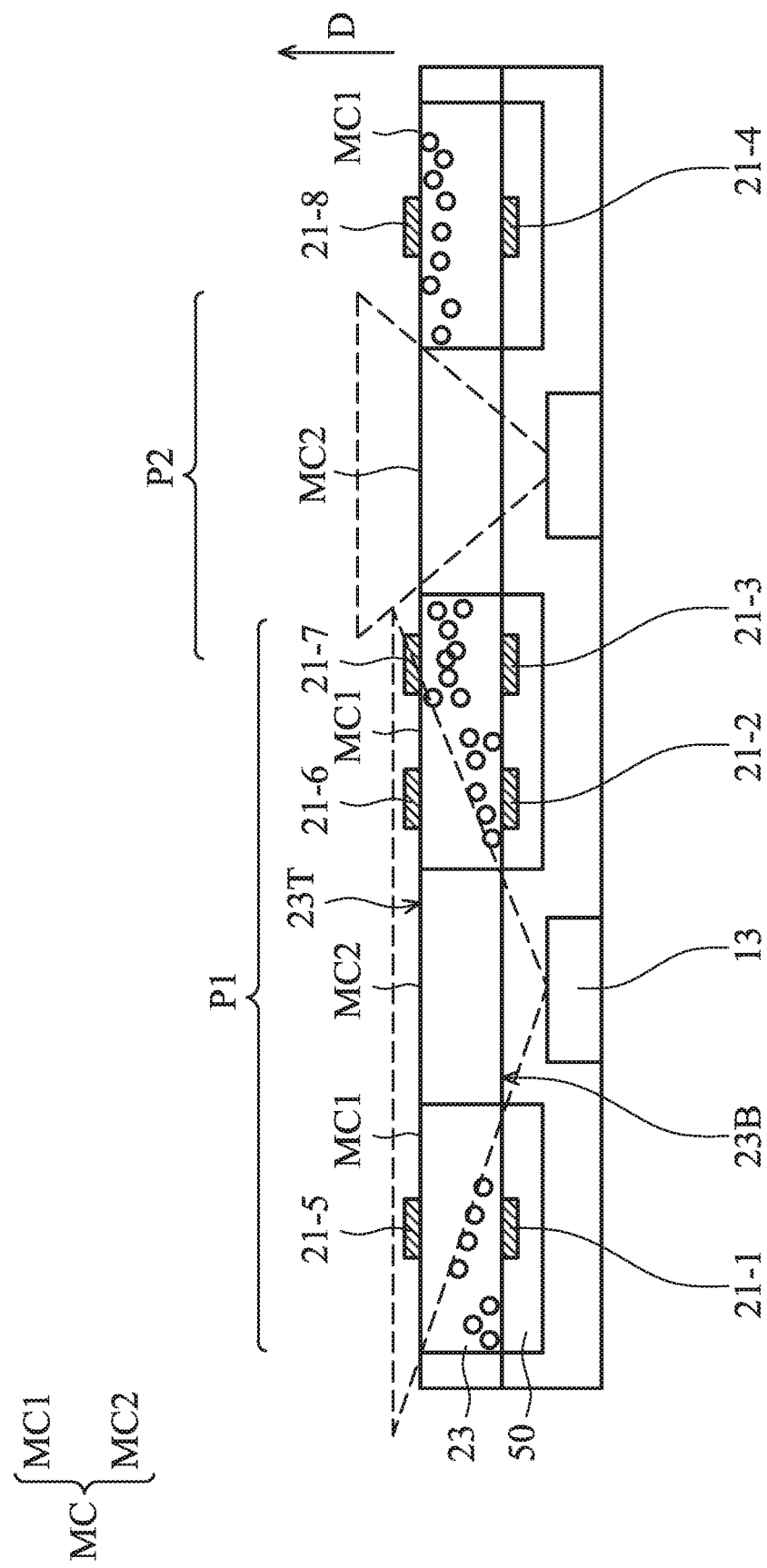
FIG. 7 is a cross-sectional view illustrating a pixel structure according to another embodiment of the present disclosure at a wide viewing angle and a privacy viewing angle.

In the foregoing embodiments, the shading electrodes are all disposed below the shading layer 23 (e.g., disposed on the bottom surface 23B of the shading layer 23), but the present disclosure is not limited thereto. FIG. 7 is a cross-sectional view illustrating a pixel structure according to another embodiment of the present disclosure at a wide viewing angle and a privacy viewing angle. Similarly, the pixel P1 presenting the wide viewing angle and the pixel P2 presenting the private viewing angle may be two different states of the same pixel, or two different pixels (e.g., two adjacent pixels) in FIG. 7. The pixel structures of the pixel P1 and the pixel P2 shown in FIG. 7 may correspond to the pixel structure 100 shown in FIG. 1 or the pixel structure 102 shown in FIG. 2. Therefore, the pixel switch element 11 (and the shading switch element 25) is omitted in FIG. 7.

One of the differences from the embodiment shown in FIG. 6 is that the pixel structure shown in FIG. 7 may further include a shading electrode 21-5, a shading electrode 21-6, a shading electrode 21-7, and a shading electrode 21-8, and the shading electrode 21-5, the shading electrode 21-6, the shading electrode 21-7, and the shading electrode 21-8 are respectively opposed to the shading electrode 21-1, the shading electrode 21-2, the shading electrode 21-3, and the shading electrode 21-4. That is, the shading electrode 21-5, the shading electrode 21-6, the shading electrode 21-7, and the shading electrode 21-8 may be disposed on the top surface 23T of the shading layer 23, but the present disclosure is not limited thereto.

In some other embodiments, the shading electrode 21-5, the shading electrode 21-6, the shading electrode 21-7, and the shading electrode 21-8 may also not be opposed to the shading electrode 21-1, the shading electrode 21-2, the shading electrode 21-3, and the shading electrode 21-4. Alternatively, the number of shading electrodes disposed on the top surface 23T of the shading layer 23 and the number of shading electrodes disposed on the bottom surface 23B of the shading layer 23 may be different.

Moreover, the pixel structure shown in FIG. 7 includes a light-shielding material layer 50, and the shading electrode 21-1, the shading electrode 21-2, the shading electrode 21-3, and/or the shading electrode 21-4 are disposed in the light-shielding material layer 50. That is, the light-shielding material layer 50 is disposed on the bottom surface 23B of the shading layer 23, but the present disclosure is not limited thereto. In some other embodiments, the light-shielding material layer 50 may also be disposed on the top surface 23T of the shading layer 23, and the shading electrode 21-5, the shading electrode 21-6, the shading electrode 21-7, and/or the shading electrode 21-8 may be disposed in the light-shielding material layer 50. The position of the light-shielding material layer 50 and the relationship between the light-shielding material layer 50 and the shading electrodes may be adjusted according to actual need.

When the non-transparent conductive particles in (the first portion MC1 of) the microcapsule structure MC are negatively charged particles, a positive voltage may be applied to the shading electrode 21-1 and the shading electrode 21-2, and a relatively low voltage (e.g., negative voltage, low potential, ground, or floating voltage) may be applied to the shading electrode 21-5 and the shading electrode 21-6, so that the non-transparent conductive particles are pulled by the electric field to approach the shading electrode 21-1 and the shading electrode 21-2 (i.e., away from the shading electrode 21-5 and the shading electrode 21-6); or a relatively high voltage (e.g., positive voltage, high potential, ground, or floating voltage) may be applied to the shading electrode 21-1 and the shading electrode 21-2, and a negative voltage may be applied to the shading electrode 21-5 and the shading electrode 21-6, so that the non-transparent conductive particles are pulled by the electric field to approach the shading electrode 21-1 and the shading electrode 21-2 (i.e., away from the shading electrode 21-5 and the shading electrode 21-6), thereby rendering the pixel P1 a wide viewing angle.

When the non-transparent conductive particles in (the first portion MC1 of) the microcapsule structure MC are negatively charged particles, a negative voltage may be applied to the shading electrode 21-3 and the shading electrode 21-4, and a relatively high voltage (e.g., positive voltage, high potential, ground, or floating voltage) may be applied to the shading electrode 21-7 and the shading electrode 21-8, so that the non-transparent conductive particles are pulled by the electric field away from the shading electrode 21-3 and the shading electrode 21-4 (i.e., near the shading electrode 21-7 and the shading electrode 21-8); or a relatively low voltage (e.g., negative voltage, low potential, ground, or floating voltage) may be applied to the shading electrode 21-3 and the shading electrode 21-4, and a positive voltage may be applied to the shading electrode 21-7 and the shading electrode 21-8, so that the non-transparent conductive particles are pulled by the electric field away from the shading electrode 21-3 and the shading electrode 21-4 (i.e., near the shading electrode 21-7 and the shading electrode 21-8), thereby rendering the pixel P2 a privacy viewing angle.

When the non-transparent conductive particles in (the first portion MC1 of) the microcapsule structure MC are positively charged particles, a negative voltage may be applied to the shading electrode 21-1 and the shading electrode 21-2, and a relatively high voltage (e.g., positive voltage, high potential, ground, or floating voltage) may be applied to the shading electrode 21-5 and the shading electrode 21-6, so that the non-transparent conductive particles are pulled by the electric field to approach the shading electrode 21-1 and the shading electrode 21-2 (i.e., away from the shading electrode 21-5 and the shading electrode 21-6); or a relatively low voltage (e.g., negative voltage, low potential, ground, or floating voltage) may be applied to the shading electrode 21-1 and the shading electrode 21-2, and a positive voltage may be applied to the shading electrode 21-5 and the shading electrode 21-6, so that the non-transparent conductive particles are pulled by the electric field to approach the shading electrode 21-1 and the shading electrode 21-2 (i.e., away from the shading electrode 21-5 and the shading electrode 21-6), thereby rendering the pixel P1 a wide viewing angle.

When the non-transparent conductive particles in (the first portion MC1 of) the microcapsule structure MC are positively charged particles, a positive voltage may be applied to the shading electrode 21-3 and the shading electrode 21-4, and a relatively low voltage (e.g., negative voltage, low potential, ground, or floating voltage) may be applied to the shading electrode 21-7 and the shading electrode 21-8, so that the non-transparent conductive particles are pulled by the electric field away from the shading electrode 21-3 and the shading electrode 21-4 (i.e., near the shading electrode 21-7 and the shading electrode 21-8); or a relatively high voltage (e.g., positive voltage, high potential, ground, or floating voltage) may be applied to the shading electrode 21-3 and the shading electrode 21-4, and a negative voltage may be applied to the shading electrode 21-7 and the shading electrode 21-8, so that the non-transparent conductive particles are pulled by the electric field away from the shading electrode 21-3 and the shading electrode 21-4 (i.e., near the shading electrode 21-7 and the shading electrode 21-8), thereby rendering the pixel P2 a privacy viewing angle.

Figure 8:
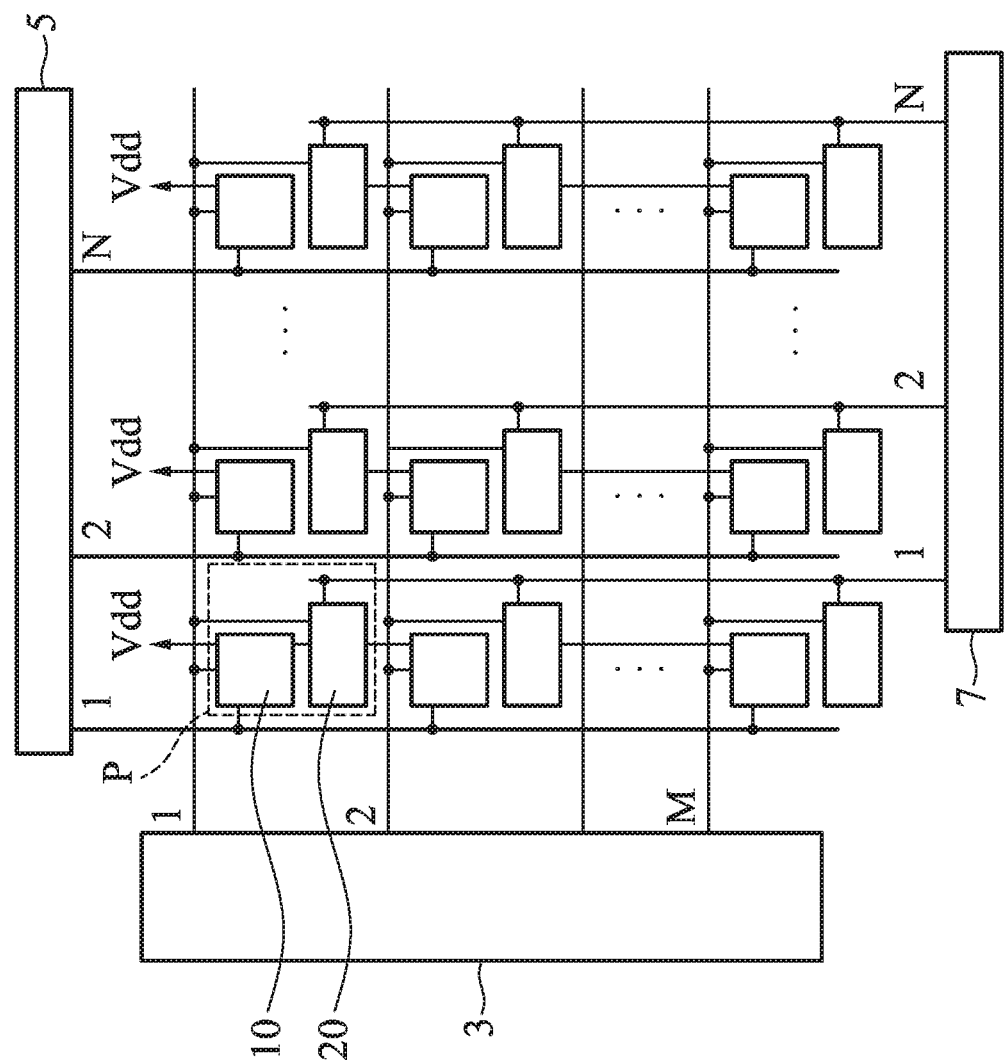
FIG. 8 is a partial schematic diagram illustrating a display device according to an embodiment of the present disclosure.

FIG. 8 is a partial schematic diagram illustrating a display device 1 according to an embodiment of the present disclosure. It should be noted that FIG. 8 shows the electrical connection relationship of each component in the display device 1, not the actual structure of the display device 1, and some components may be omitted.

Referring to FIG. 8, the display device 1 includes a pixel array composed of M×N (M, N are positive integers) pixel structures P. That is, the pixel array includes a plurality of pixel structures P. In some embodiments, the pixel structure P has the same or similar structure as the pixel structure 100 shown in FIG. 1 or the pixel structure 102 shown in FIG. 2, and may exhibit a wide viewing angle and a privacy viewing angle as shown in FIG. 3, FIG. 5, FIG. 6 or FIG. 7.

In other words, the pixel structure P shown in FIG. 8 may include a display unit 10 and a shading unit 20, and at least a portion of the shading unit 20 is disposed on the display unit 10. The display unit 10 includes a pixel switch element 11 and a self-illuminating element 13 that is electrically connected to the pixel switch element 11. The shading unit 20 includes a shading electrode 21 and a shading layer 23 that is disposed on the self-illuminating element 13 and electrically connected to the shading layer 21. In FIG. 8, in order to more clearly show that the electrical connection of the display unit 10 and the electrical connection of the shielding unit 20 are different, the two components are shown as separated, but it does not represent the actual structure and position of the display unit 10 and the shielding unit 20.

Referring to FIG. 8, the display device 1 includes a scanning circuit 3. The scanning circuit 3 may be a gate IC/circuit, and is electrically connected to the display unit 10 of the pixel structure P. The display device 1 also includes a data circuit 5 (e.g., data IC), and the data circuit 5 is electrically connected to the display unit 10 of the pixel structure P. The display device 1 further includes a shading control circuit 7 (e.g., shading control IC), and the shading control circuit 7 is electrically connected to the shading unit 20 of the pixel structure P.

The shading control circuit 7 may be used to control the shading unit 20 of the pixel structure P. When the pixel structure P has a structure that is the same as or similar to the pixel structure 100 shown in FIG. 1, the shading control circuit 7 is (electrically) connected to the shading electrode 21 of each pixel structure 100. Under this condition, when the display device 1 needs to switch between a wide viewing angle and a private viewing angle, the shading control circuit 7 may control all pixel structures P to switch at the same time, and a comprehensive privacy viewing angle may be achieved.

When the pixel structure P has a structure that is the same as or similar to the pixel structure 102 shown in FIG. 2, the shading control circuit 7 is (electrically) connected to the shading switch element of each pixel structure 102. Under this condition, when the display device 1 needs to switch between a wide viewing angle and a private viewing angle, the shading control circuit 7 may control the specific pixel structure(s) P to switch, and a regional private viewing angle may be achieved. For example, it may be used in a car display device.

Furthermore, in some other embodiments, the display device 1 may include a plurality of shading control circuits 7, and the shading control circuits 7 may be arranged parallel to each other, but the present disclosure is not limited thereto. For example, when the pixel structure P includes more than two shading electrodes (shading electrode 21-1 and shading electrode 21-2/shading electrode 21-3 and shading electrode 21-4 as shown in FIG. 4B), these shading control circuits 7 may be used to control different shading electrodes. For example, the first shading switch element 25-1 and the second shading switch element 25-2 are controlled to respectively control the shading electrode 21-1 and the shading electrode 21-2, or the first shading switch element 25-1 and the second shading switch element 25-2 are controlled to respectively control the shading electrode 21-3 and the shading electrode 21-4.

In summary, the pixel structure and the display device using the same include a self-illuminating element and a shading layer. It may control (or switch) the shading layer by adjusting the voltage of the shading electrode to achieve a state of privacy display. In the embodiments of the present disclosure, the state of privacy display may be achieved without forming a special backlight module. The pixel structure and the display device in the embodiments of the present disclosure have the advantages of low power consumption and high brightness, and the manufacturing process is simple, which may effectively reduce the manufacturing cost and is suitable for small displays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A pixel structure, comprising:
    a display unit, comprising:
        a pixel switch element; and
        a self-illuminating element electrically connected to the pixel switch element; and
    a shading unit, wherein at least a portion of the shading unit is disposed on the display unit, and the shading unit comprises:
        a shading electrode;
        a shading layer disposed on the self-illuminating element and electrically connected to the shading electrode; and
        a light-shielding material layer disposed on at least one surface of the shading layer.

2. The pixel structure as claimed in claim 1, wherein the shading unit further comprises a shading switch element, and the shading electrode is electrically connected to the shading switch element.

3. The pixel structure as claimed in claim 2, wherein the shading switch element includes a thin film transistor.

4. The pixel structure as claimed in claim 1, wherein the shading electrode comprises a first shading electrode and a second shading electrode, and an extension direction of the first shading electrode and an extension direction of the second shading electrode are different.

5. The pixel structure as claimed in claim 4, wherein the first shading electrode and the second shading electrode are perpendicular to each other.

6. The pixel structure as claimed in claim 4, wherein the shading unit further comprises a first shading switch element and a second shading switch element, the first shading electrode is electrically connected to the first shading switch element, and the second shading electrode is electrically connected to the second shading switch element.

7. The pixel structure as claimed in claim 1, wherein the shading electrode is disposed on a bottom surface of the shading layer.

8. The pixel structure as claimed in claim 1, wherein the shading unit comprises a plurality of shading electrodes respectively disposed on a top surface and a bottom surface of the shading layer.

9. The pixel structure as claimed in claim 1, wherein the shading layer comprises a liquid material and a plurality of non-transparent conductive particles in the liquid material.

10. The pixel structure as claimed in claim 9, wherein the shading layer comprises a plurality of microcapsule structures.

11. The pixel structure as claimed in claim 10, wherein the liquid material and the plurality of non-transparent conductive particles are disposed in each of the plurality of microcapsule structures.

12. The pixel structure as claimed in claim 10, wherein the plurality of microcapsule structures are divided into a first portion and a second portion, the first portion comprises the plurality of non-transparent conductive particles and the second portion comprises no non-transparent conductive particles.

13. The pixel structure as claimed in claim 12, wherein the second portion is correspondingly disposed on the self-illuminating element.

14. The pixel structure as claimed in claim 12, wherein the first portion does not overlap or partially overlaps the self-illuminating element.

15. The pixel structure as claimed in claim 1, wherein the shading electrode is disposed in the light-shielding material layer.

16. The pixel structure as claimed in claim 1, further comprises:
    an upper electrode disposed on a top surface of the shading layer.

17. The pixel structure as claimed in claim 1, wherein the pixel switch element includes a thin film transistor.

18. A display device, comprising:
    a pixel array comprises a plurality of pixel structures, wherein each of the pixel structures comprises a display unit and a shading unit, the display unit comprises a pixel switch element and a self-illuminating element electrically connected to the pixel switch element, at least a portion of the shading unit is disposed on the display unit, and the shading unit comprises a shading electrode a shading layer disposed on the self-illuminating element and electrically connected to the shading electrode, and a light-shielding material layer disposed on at least one surface of the shading layer;
    a scanning circuit electrically connected to the display unit of each of the pixel structures;
    a data circuit electrically connected to the display unit of each of the pixel structures; and
    a shading control circuit electrically connected to the shading unit of each of the pixel structures.

19. The display device as claimed in claim 18, wherein the shading unit comprises a plurality of shading electrodes, and the display device comprises a plurality of shading control circuits electrically connected to the plurality of shading electrodes.

* * * * *